(12) United States Patent
Mangano et al.

(10) Patent No.: US 7,305,845 B2
(45) Date of Patent: Dec. 11, 2007

(54) SYSTEM AND METHOD FOR DE-ICING RECONDENSOR FOR LIQUID COOLED ZERO-BOIL-OFF MR MAGNET

(75) Inventors: Roy A. Mangano, Florence, SC (US); In-Hua Xu, Florence, SC (US); Gregory A. Lehmann, Florence, SC (US); Deborah R. Mantone, Florence, SC (US)

(73) Assignee: General Electric Company, Schenectady, NY (US)

( * ) Notice: Subject to any disclaimer, the term of this patent is extended or adjusted under 35 U.S.C. 154(b) by 534 days.

(21) Appl. No.: 10/708,477

(22) Filed: Mar. 5, 2004

(65) Prior Publication Data

US 2005/0193745 A1    Sep. 8, 2005

(51) Int. Cl.
*F25D 21/06* (2006.01)
*H01F 5/00* (2006.01)

(52) U.S. Cl. .................. 62/276; 62/51.1; 335/300

(58) Field of Classification Search .................. 62/51.1, 62/47.1, 276, 48.2
See application file for complete search history.

(56) References Cited

U.S. PATENT DOCUMENTS

| 5,060,481 | A | * | 10/1991 | Bartlett et al. | ............... 62/51.2 |
| 5,782,095 | A | * | 7/1998 | Chen | ........................ 62/47.1 |
| 5,848,532 | A | * | 12/1998 | Gamble et al. | ............... 62/48.2 |
| 5,936,499 | A | * | 8/1999 | Eckels | ........................ 335/216 |
| 6,626,004 | B2 | * | 9/2003 | Lee | ............................. 62/276 |

\* cited by examiner

*Primary Examiner*—Marc Norman
(74) *Attorney, Agent, or Firm*—Ziolkowski Patent Solutions Group, SC

(57) ABSTRACT

A system and method for de-icing a recondensor includes at least one heating element configured to melt iced particles from a recondensing system. A power delivery circuit is included configured to deliver power to the at least one resistive heating element such that the at least one resistive heating element delivers a supply of heat sufficient to melt the iced particles from the recondensing system.

37 Claims, 3 Drawing Sheets

SYSTEM AND METHOD FOR DE-ICING RECONDENSOR FOR LIQUID COOLED ZERO-BOIL-OFF MR MAGNET

BACKGROUND OF INVENTION

The present invention relates generally to a magnetic resonance (MR) imaging and, more particularly, to a non-intrusive system and method for de-icing a recondensor system and method of a liquid cooled superconducting MR magnet.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

To generate the necessary magnetic fields, high-field MRI magnets are utilized. The superconducting magnet, which is typically composed of wire, becomes a superconductor when cooled to a desired cryogenic temperature range. To achieve the desired cryogenic temperature, a cryogen is used to continuously cool the superconducting magnet. One common cryogen used for superconducting magnets is helium, which maintains a liquid state at approximately 4.2 degrees Kelvin (K). A bath of liquid helium is utilized to cool the superconducting wire so that the magnet can be energized or ramped to generate a desired magnetic field. The specific magnetic field achieved is a function of the number of turns in the wire, the ramp current, and the ramp voltage. Ideally, once the magnet is ramped, the magnet sustains the desired magnetic field until the magnet is ramped down. However, on occasion, the magnetic field is not sustained over the desired duration due to the temperature of the magnet rising above the temperature range necessary for the wire to act as a superconductor. In this case, the magnet quenches and the desired magnetic field is no longer generated.

To avoid quenching, closed loop or zero-boil-off cooling systems have been developed to continuously condense any helium that evaporates or boils-off. In a zero-boil-off cooling system, a constant helium level/volume is maintained within a magnet helium vessel, which houses the superconducting magnet, through the use of a recondensor that cools and liquefies boiled-off helium.

Under normal operating conditions, the magnet helium vessel operates at a pressure above atmospheric pressure to improve the efficiency of the zero-boil-off cooling system and prevent inflow of atmospheric air. Operating above atmospheric pressure is particularly important to prevent the ingress of atmosphere air because atmospheric air consists primarily of nitrogen and oxygen which have freezing temperatures of approximately 63 degrees K and 54 degrees K, respectively. Additionally, atmospheric air contains water vapor in the form of relative humidity, which has a freezing temperature of approximately 273 degrees K. As such, any air that enters (through a leak or unplanned opening) the magnet helium vessel freezes and, as such, may serve as an impediment to the zero-boil-off cooling system and interfere with maintaining the temperature of the liquid helium.

During operations which involve reducing the pressure within the magnet helium vessel to atmospheric pressure, the magnet helium vessel exists in a state which makes it particularly susceptible to air ingress. For example, during a magnet ramp or when filling the magnet helium vessel with liquid helium, the magnet pressure is brought to equilibrium with atmospheric pressure and then the magnet helium vessel is opened to allow feedthrough of ramp leads or a helium fill line. Through these operations, the potential exists for ice to build up in the reliquifier of the zero-boil-off system. If the reliquifier ices, the system will not recondense the boiled-off helium and the cooling system will cease to operate in zero-boil-off mode.

In such a case, excessive helium boil-off results and raises the pressure in the magnet helium vessel. Accordingly, a pressure relief valve is typically located outside the magnet helium vessel and is preset to open at a selected pressure that is greater than that of a normal operating pressure. When the magnet helium vessel pressure rises to the preset limit, the pressure relief valve opens to release the rising pressure at the expense of helium loss.

To rectify this situation, the MRI system typically must be removed from service to allow substantial servicing by field engineers to de-ice the cooling system. Specifically, the MRI apparatus must be powered down and a field engineer must open the cooling system via a bypass cooling loop and spray warm helium gas into the iced areas. Additionally, the recondensor, which serves to cool the evaporated helium back to a liquid, must be heated. However, upon opening the cooling system to purge it with warm helium gas, the potential exists to further contaminate the magnet helium vessel with air.

Furthermore, opening the cooling system to the atmosphere also usually results in a magnet quench when the ice clears from the cooling system and the injected warm helium gas comes in contact with the liquid helium and the superconducting magnet. As such, the magnet must again be ramped up (i.e. magnet coil re-energized) before operating the MRI apparatus.

It would therefore be desirable to have a system and method capable of de-icing a recondensor system of a liquid cooled superconducting MR magnet without potentially contaminating the magnet helium vessel with air. Additionally, it would be desirable to have a system and method to de-ice a recondensor system of a liquid cooled superconducting MR magnet without the risk of quenching the magnet.

BRIEF DESCRIPTION OF INVENTION

The present invention provides a system and method for de-icing a recondensor system for a liquid cooled superconducting MR magnet that overcomes the aforementioned drawbacks. The present invention provides a system and method to de-ice a recondensor system without introducing potential contaminants into the magnet helium vessel. Additionally, the present invention includes a system and method to de-ice a recondensor system of a liquid cooled superconducting MR magnet while reducing the potential of quenching the magnet.

In accordance with one aspect of the invention, a system to de-ice a recondensor of an MR system is disclosed that includes an MR system having a superconducting magnet in a sealed vessel and a recondensor system configured to cool the superconducting magnet. The recondensor system includes at least one heating element configured to melt iced particles from the recondensing system and a power delivery circuit configured to deliver power to the at least one heating element such that the at least one heating element delivers a supply of heat sufficient to melt the iced particles from the recondensing system.

According to another aspect of the invention, a recondensor system of an MR system is disclosed that includes a superconducting magnet immersed in a bath of liquid coolant and a recondensor configured to cool gaseous coolant to a liquid coolant. A supply tube is connected to the recondensor and configured to deliver gaseous coolant to the recondensor and a delivery tube is connected to the recondensor and configured to remove liquid coolant from the recondensor. The recondensor system also includes at least one resistive element configured to selectively deliver a supply of heat to at least one of the recondensor, the supply tube, and the delivery tube to melt ice particles.

In accordance with another aspect, the invention includes an MRI apparatus that includes an MRI system having a plurality of gradient coils positioned about a bore of a superconducting magnet to impress a polarizing magnetic field, and an RF transceiver system and an RF switch controlled by a pulse module to transmit RF signals to an RF coil assembly to acquire MR images. The MRI apparatus also includes a cooling system arranged about the superconducting magnet. The cooling system includes a sealed chamber forming a cooling jacket configured to pool coolant around the superconducting magnet, a recondensor connected to the cooling jacket and configured to condense evaporated coolant, and at least one heating component configured to de-ice the recondensor.

In accordance with yet another aspect of the invention, a method of non-invasive de-icing of a recondensor system of a superconducting MR magnet assembly is disclosed that includes heating portions of a recondensing system to melt ice deposits on at least the recondensing system, wherein the recondensing system is configured to condense a coolant of a superconducting MR magnet system and vacuumously removing melted ice deposits.

Various other features, objects and advantages of the present invention will be made apparent from the following detailed description and the drawings.

BRIEF DESCRIPTION OF DRAWINGS

The drawings illustrate one preferred embodiment presently contemplated for carrying out the invention.

In the drawings.

DETAILED DESCRIPTION

Figure 1:
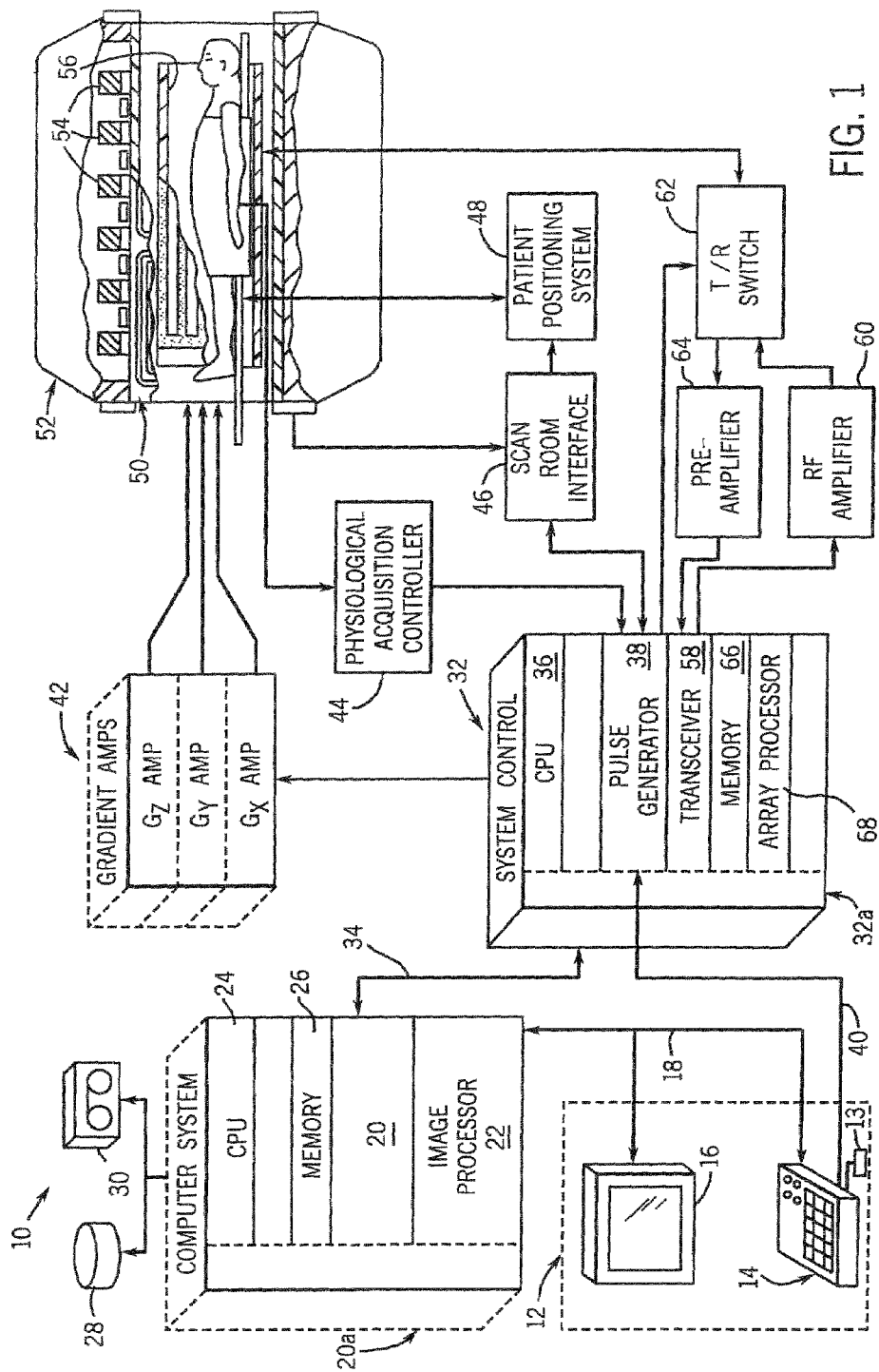
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a superconducting magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rear-ranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
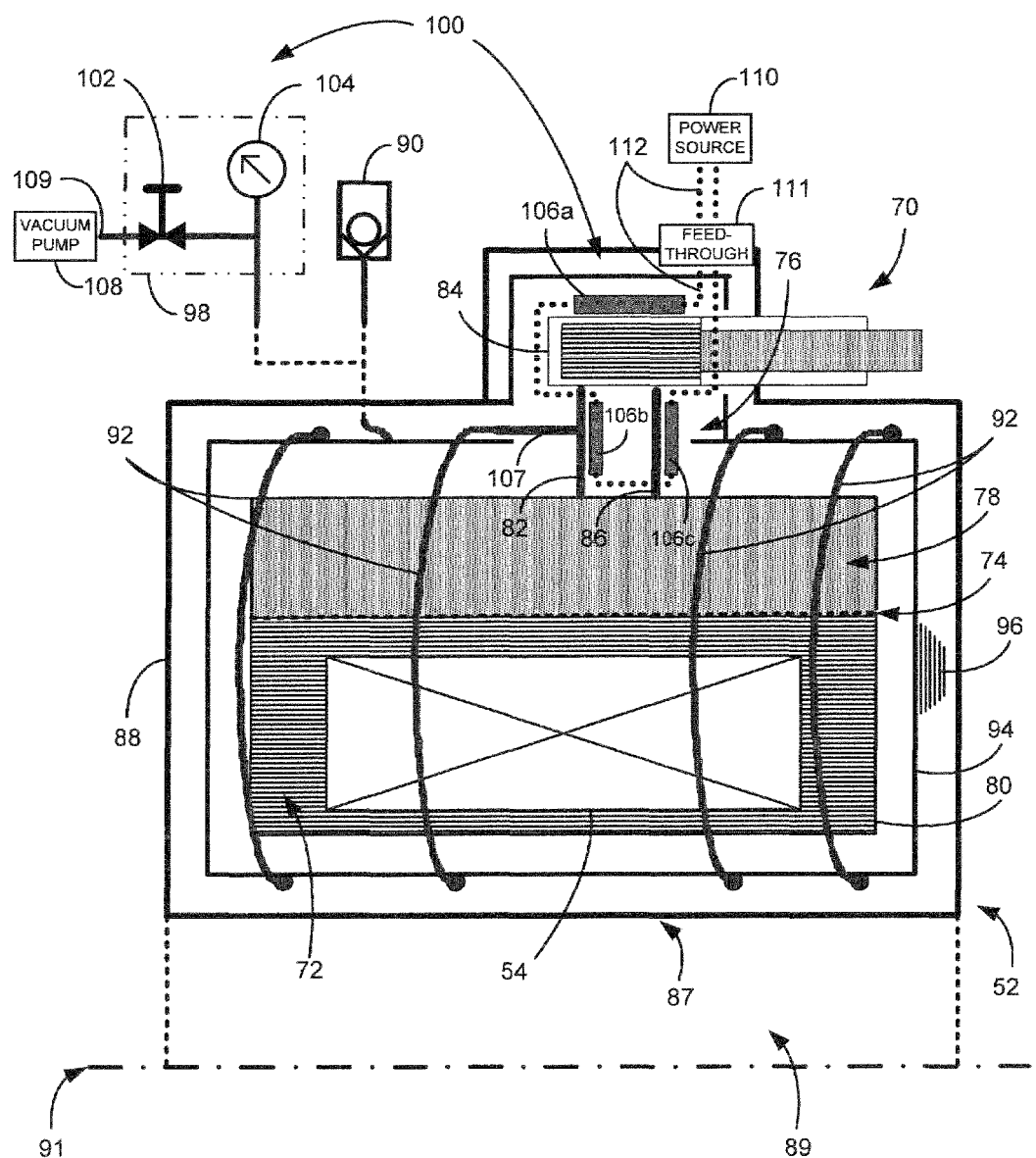
FIG. 2 is a schematic diagram of a cryo-refrigeration system including a recondensor de-icing system for liquid helium cooled, zero-boil-off superconducting MR magnet in accordance with the present invention.

Referring to FIG. 2, a schematic diagram of the MR superconducting magnet 54 and associated cooling system 70 are shown. The cooling system 70 encloses and forms a cooling jacket around the superconducting MR magnet 54 such that the superconducting MR magnet 54 is covered with a liquid helium bath 72 in a sealed vessel. A proper level of liquid helium 74 is maintained by the cooling system 70 by sending gaseous (boil-off) helium through a recondensor flow loop or cooling loop 76. That is, the evaporated helium 78 is permitted to escape a magnet helium vessel 80 through a supply tube 82 that leads to a recondensor 84. The recondensor 84 cools the gaseous helium 78 and returns liquid helium 72 through a delivery tube 86. A magnet vacuum vessel 88 serves to minimize the heat load to the helium vessel. An outer surface 87 of the magnet vacuum vessel 88 forms an inner bore section 89 formed to define a patient space where the patient is placed during imaging. As illustrated by a magnet centerline 91, the inner bore 89 forms a symmetrical patient space.

In the event of a pressure surge within the magnet helium vessel 80, a pressure relief valve 90 is included that allows the escape of cold helium gas through a bypass in the form of an auxiliary cooling loop 92 that surrounds a thermal shield 94 and passes through a multi-layer insulation 96. As will be described, a recondensor de-icing system 100 is included to perform a non-invasive de-icing. That is, if the cooling loop 76 becomes iced, the pressure relief valve is replaced with a vacuum valve system 98 including a vacuum valve 102 and a pressure gauge 104, and a plurality of strategically placed heating components 106a-c are activated.

As stated, under normal operating conditions, the magnet helium vessel 80 operates at a pressure above atmospheric pressure to improve the efficiency of the zero-boil-off cooling system 70 and prevent any inflow of atmospheric air. The magnet vacuum vessel 88 forms a vacuum barrier to insulate the cooling system 70 from the heat load of the atmosphere. Should air penetrate the cooling system, for example, during a magnet ramp or when filling the magnet helium vessel 80 with liquid helium 72, an ice build-up typically occurs in the cooling loop 76 of the magnet zero-boil-off system 70. Once the cooling loop 76 ices, the zero-boil-off system 70 ceases to re-liquefy the boiled-off helium 78.

Since the magnet helium vessel 80 is a closed system, the helium boil-off 78 raises the pressure in the magnet helium vessel 80 and subsequently, in the cooling loop 76. Accordingly, the pressure relief valve 90 opens and helium gas flows through the auxiliary cooling loop 92. The auxiliary cooling loop 92 provides cooling to the thermal shield 94 while the cooling loop is non-operational. The auxiliary cooling loop 92 functions as a heat intercept that reduces the heat flux exposure of the magnet helium vessel 80. Since the auxiliary cooling loop is directly connected to the cooling loop through a tee 107 from the cooling loop 76, the flow of evacuating helium from the supply tube 82 cools a thermal shield 94 and reduces the heat load to the magnet helium vessel 80 but at the expense of helium loss.

However, once an increase in pressure is detected, the recondensor de-icing system 100 may be utilized to remove any ice build-up without subjecting the cooling system 70 to the ingress of atmospheric air. The recondensor de-icing system 100 functions by non-intrusively clearing ice from the cooling loop 76, thereby averting exposing the cooling system 70 to atmospheric air. The recondensor de-icing system 100 provides the field engineer with a safe and effective method of removing air based ice blocks without opening the cooling system 70 and exposing the magnet helium vessel 94 to further contaminate air ingestion and to prevent magnet quench which results in excessive helium loss.

The recondensor de-icing system 100 includes heating elements 106a-c that are located at key positions on the cooling loop 76. The heating elements 106a-c provide localized heating at key positions during the de-icing operation. The heating elements 106a-c are energized by a power source 110 through a power delivery circuit 112 to supply heat sufficient to melt the iced cooling loop 76. As will be described with respect to FIG. 3, the heating elements 106a-c are located at positions where ice accumulates most often and are energized through the power delivery circuit which passes through a feedthrough 111 that allows the heating elements 106a-c to receive power without compromising the seal of the magnet vacuum vessel 88.

By way of illustration, three particular key points are illustrated; however, it is recognized that additional key positions may be utilized. Furthermore, while the present invention is described in accordance with a preferred embodiment, with the heating elements 106a-c positioned at the three illustrative key positions, it is possible to place the heating elements 106a-c at other less ideal positions and achieve adequate results. That is, while the present invention is described with respect to key points within one embodiment, it is possible that additional key points and/or suitable points may be utilized successfully.

To accelerate the de-icing process, the relief valve 90 on the auxiliary cooling loop 92 may be removed and replaced with a vacuum valve system 98. Accordingly, the vacuum valve system 98 is directly connected to the auxiliary cooling loop 92, which, in turn, is connected to the cooling loop 76 at a tee 107. Also part of the recondensor de-icing system 100 is a vacuum pump 108 that is connected to the vacuum valve system 98 at a connection point 109 to assist in clearing the cooling loop 76. The vacuum pump 108 serves to accelerate the de-icing process. Specifically, the melted ice particles are subjected to a vacuum pressure that serves to vacuumously remove the ice particles once melted. Therefore, when the vacuum valve 102 is opened, the auxiliary cooling loop 92 is subjected to a vacuum from the vacuum pump 108 and, as the heating elements 106a-c warm the iced cooling loop 76, the vacuum pump 108 removes molecules of melted ice. In this manner, upon application of the vacuum pump 108 to the auxiliary cooling loop 92, the auxiliary cooling loop 92 serves to function as a vacuum evacuation port for the melted ice particles.

The vacuum pump 108 is applied until the ice melts and helium flow returns to the cooling loop 76. The pressure gauge 104 indicates the pressure in the cooling loop 76 and aids the field engineer in controlling the de-icing process. Initially, with the vacuum pump 108 operating to create a vacuum within the auxiliary cooling loop 92, the pressure gauge 104 indicates a vacuum load. However, as the ice block clears, the pressure rises until it matches the pressure in the magnet helium vessel 80.

At this point, the field engineer closes the vacuum valve 102, which removes the vacuum pressure from the auxiliary cooling loop 92 and the cooling loop 76. That is, once helium is flowing, the vacuum valve 102 is closed, the vacuum valve system 98 is removed, and the pressure relief valve 90 is replaced. The heater power source 110 may be turned off and/or disconnected and the closed-cycle cooling system 70 may be restarted to resume normal helium re-liquefication.

Figure 3:
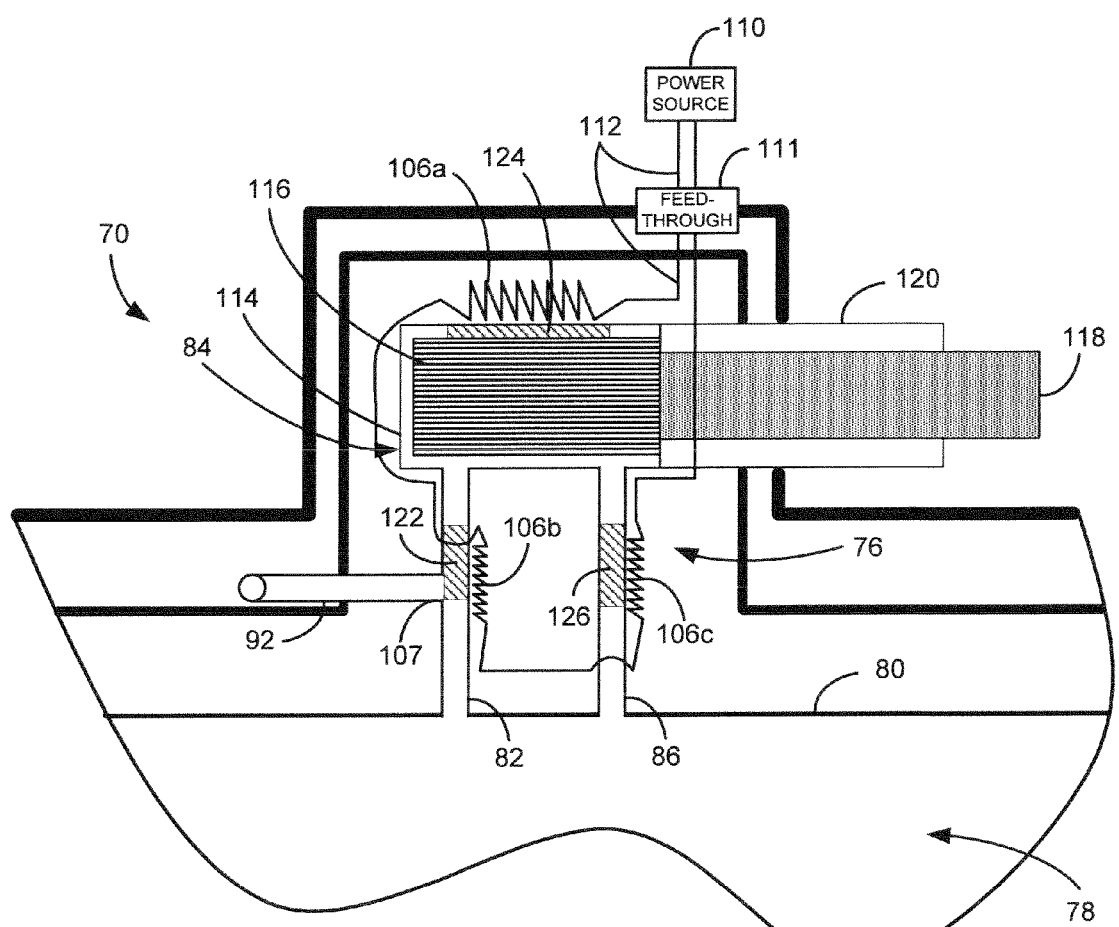
FIG. 3 is an enlarged schematic diagram of a portion of the system of FIG. 2.

Referring now to FIG. 3, a detailed view of the cooling loop 76 and heating elements 106a-c is shown. Again, as the liquid helium boils off, the boil-off is collected in the cooling loop 76. The cooling loop directs the gaseous helium 78 to the recondensor 84. The recondensor 84 includes a recondensor can 114 that houses heat exchanger fins 116. The recondensor can 114 re-liquefies the helium gas 78 through the removal of heat by the exchanger fins 116. As the helium liquefies, it drains back into the magnet helium vessel 80 via the delivery tube 86 of the recondensor loop 76. Thus the cooling system 70 continually "recharges" the magnet helium vessel 80 with liquid helium. Heat removal is effectuated by a closed-cycle refrigerator 118 that is capable of cooling the gaseous helium 78 to approximately 4.2 degrees K under heat load conditions, which causes the gaseous helium 78 to condense to a liquid. The closed-cycle refrigerator 118 connects to the recondensor can 114 through a cold sleeve 120 that provides a vacuum barrier for the magnet vacuum vessel 88 and prevents ingress of atmospheric air.

However, should atmospheric air pervade the pressure sealed magnet helium vessel 80, the atmospheric air is quickly frozen 122-126. As shown, the most common areas for the atmospheric air to freeze are within the supply tube 82, 122, the delivery tube 86, 126, and the recondensor 84, 124. As such, the plurality of heating elements 106a-c is connected to selectively heat these key areas. In accordance with a preferred embodiment, the plurality of heating elements 106a-c includes a first resistive element 106a, a second resistive element 106b, and a third resistive element 106c.

In accordance with a preferred embodiment, the resistive elements 106a-c are connected in series within the power delivery circuit 112. However, it is contemplated that the resistive elements 106a-c may be connected in parallel or any combination of series and parallel connections. Furthermore, the resistive elements 106a-c are preferably configured such that an effective resistance value of the resistive element 106a is twice that of the effective resistance value of the resistive elements 106b or 106c. That is, the effective resistance of the resistive element 106a equals the effective resistance value of the resistive element 106b plus the effective resistance value of the effective resistance 106c. It is understood that this effective resistance relationship may be achieved through the inherent resistances of the resistive elements 106a-c or through the inherent resistance of resistive elements in combination with the connection arrangement of the resistive elements within the power delivery circuit. This arrangement of effective resistances ensures that the power consumed to produce heat by the resistive element 106a will be twice the power consumed by either the resistive element 106b or the resistive element 106c when a power is supplied to the resistive elements 106a-c by power source 110. As such, the heat delivered by the resistive element 106a will be twice the individual heat delivered by the resistive elements 106b and 106c.

As stated, the resistive elements 106a-c are connected to the power delivery circuit 112 that delivers power from a power source 110 to the resistive elements 106a-c through a feedthrough 111. The electrical feedthrough 111 serves as a conduit into the magnet helium vessel 80 whereby electrical power is delivered to the resistive elements 106a-c without compromising the pressure seal of the cooling system 70. The resistive elements 106a-c receive input power only when the power source 110 is connected and, otherwise, the resistive elements 106a-c remain inactive.

When ice 122-126 builds up within the cooling loop 76, the power source 110 can be turned on to deliver power to the resistive heating elements 106a-c via the power delivery circuit 112 and through feedthrough 111. The resistive elements begin heating the ice particles 122-126 in order to melt the ice particles 122-126. In accordance with a preferred embodiment, the magnitude of the heat delivered to the iced particles 122-126 by the resistive elements 106a-c is such that the iced particles are sublimated. The sublimated particles are than vacuumously evacuated through the auxiliary cooling loop 92 as described with respect to FIG. 2. Once the ice particles 122-126 have been melted, the power source 110 is removed and the cooling system 70 is activated to return to normal operation.

Accordingly, a system and method are disclosed whereby a cooling system 70 for a liquid cooled superconducting MR magnet 54 may be non-invasively de-iced. The above-described technique provides a system and method for de-icing a cooling loop 76 that includes a recondensor 84 that eliminates the potential to contaminate the magnet helium vessel 80 with atmospheric air. Additionally, the above-described technique allows de-icing of a liquid cooled superconducting MR magnet system 52 without having to quench the superconducting magnet 54 prior to de-icing.

Therefore, in accordance with one embodiment of the invention, a system to de-ice a recondensor of an MR system includes an MR system having a superconducting magnet in a sealed vessel and a recondensor system configured to cool the superconducting magnet. The recondensor system includes at least one heating element configured to melt iced particles from the recondensing system and a power delivery circuit configured to deliver power to the at least one heating element such that the at least one heating element delivers a supply of heat sufficient to melt the iced particles from the recondensing system.

In accordance with another embodiment aspect of the invention, a recondensor system of an MR system includes a superconducting magnet immersed in a bath of liquid cooling and a recondensor configured to cool gaseous coolant to a liquid coolant. A supply tube is connected to the recondensor and configured to deliver gaseous coolant to the recondensor and a delivery tube is connected to the recondensor and configured to remove liquid coolant from the recondensor. The recondensor system also includes at least one resistive element configured to selectively deliver a supply of heat to at least one of the recondensor, the supply tube, and the delivery tube to melt ice particles.

In accordance with another embodiment of the invention, an MRI apparatus includes an MRI system having a plurality of gradient coils positioned about a bore of a superconducting magnet to impress a polarizing magnetic field, and an RF transceiver system and an RF switch controlled by a pulse module to transmit RF signals to an RF coil assembly to acquire MR images. The MRI apparatus also includes a cooling system arranged about the superconducting magnet. The cooling system includes a sealed chamber forming a cooling jacket configured to circulate coolant around the superconducting magnet, a recondensor connected to the cooling jacket and configured to condense evaporated coolant, and at least one heating component configured to de-ice the recondensor.

In accordance with yet another embodiment of the invention, a method of non-invasive de-icing of a recondensor system of a superconducting MR magnet assembly includes heating portions of a recondensing system to melt ice deposits on at least the recondensing system, wherein the recondensing system is configured to condense a coolant of a superconducting MR magnet system and vacuumously removing melted ice deposits.

The present invention has been described in terms of the preferred embodiment, and it is recognized that equivalents, alternatives, and modifications, aside from those expressly stated, are possible and within the scope of the appending claims.

What is claimed is:

1. A system to de-ice a recondensor of an Magnetic Resonance (MR) system comprising:
   an MR system having a superconducting magnet in a sealed vessel; and
   a recondensing system configured to cool the superconducting magnet including:
      at least one heating element configured to melt iced particles disposed within the sealed vessel;
      a power delivery circuit configured to deliver power to the at least one heating element such that the at least one heating element delivers a supply of heat sufficient to melt the iced particles from the recondensing system; and
      wherein the at least one heating element is configured to melt iced particles forming on an interior surface of the recondensing system, inside the sealed vessel.

2. The system of claim 1 further comprising a vacuum supply configured to remove the melted particles from the recondensing system.

3. The system of claim 2 wherein the vacuum supply is configured to remove sublimated particles through an auxiliary cooling loop.

4. The system of claim 2 further comprising:
   a vacuum supply valve connected to the recondensing system through a cooling loop and configured to control the vacuum supply; and
   pressure gauge connected to the vacuum supply valve.

5. The system of claim 4 wherein the pressure gauge is configured to indicate when the vacuum supply valve should be actuated.

6. The system of claim 4 wherein the vacuum supply valve and pressure gauge are configured to replace a pressure release valve upon an indication of a pressure build-up indicative of recondensor icing.

7. The system of claim 1 wherein the sealed vessel is pressure-sealed against entry of atmospheric air.

8. The system of claim 7 wherein the power delivery circuit is configured to deliver power to the at least one heating element through an electrical feedthrough into the pressure-sealed vessel, such that the at least one element generates heat when a power supply is connected to the power delivery circuit.

9. The system of claim 7 wherein the pressure-sealed vessel is configured to remain pressure sealed while the iced particles are melted.

10. The system of claim 1 wherein the sealed vessel contains a substantial vacuum therein and wherein the at least one heating element is configured to melt ice particles formed of air contaminating the substantial vacuum of the sealed vessel.

11. A recondensor system of an MR system comprising:
    a superconducting magnet immersed in a bath of liquid coolant;
    a recondensor configured to cool gaseous coolant evaporated from the bath to liquid coolant;
    a supply tube connected to the recondensor and configured to deliver gaseous coolant to the recondensor;
    a delivery tube connected to the recondensor and configured to remove liquid coolant from the recondensor;
    at least one resistive element configured to selectively deliver a supply of heat to at least one of the recondensor, the supply tube, and the delivery tube to melt ice particles; and
    wherein the at least one resistive element includes a first resistive component, a second resistive component, and a third resistive component and wherein the first resistive component is configured to de-ice the recondensor, the second resistive component is configured to de-ice the supply tube, and the third resistive component is configured to de-ice the delivery tube.

12. The system of claim 11 wherein the recondensor includes a plurality of heat exchanging fins to cool gaseous coolant and is configured to be cooled by a closed-cycle refrigerator.

13. The system of claim 11 wherein the first resistive component has a first effective resistance value, the second resistive component has a second effective resistance value, and the third resistive component has a third effective resistance value and wherein the first effective resistance value is approximately equal to the sum of the second and the third effective resistance values.

14. The system of claim 13 wherein the effective resistance value of the second resistive component is approximately equal to the effective resistance value of the third resistive component.

15. The system of claim 11 further comprising a power circuit configured to deliver power to the at least one resistive heating element such that the at least one resistive heating element delivers a supply of heat sufficient to melt the iced particles.

16. The system of claim 11 wherein at least one of the supply tube and the delivery tube is configured to receive a vacuum evacuation port such that the melted ice particles are removed through the vacuum evacuation port.

17. The recondensor system of claim 11 further comprising a sealed vacuum vessel enclosing the superconducting magnet, the recondensor, the supply tube, the delivery tube, and the at least one resistive element.

18. The recondensor system of claim 17 wherein the at least one resistive element is configured to melt ice particles formed of air contaminating the sealed vacuum vessel.

19. An MRI apparatus comprising:
    an MRI system having a plurality of gradient coils positioned about a bore of a superconducting magnet to impress a polarizing magnetic field, and an RF transceiver system and an RF switch controlled by a pulse module to transmit RF signals to an RF coil assembly to acquire MR images; and a cooling system arranged about the superconducting magnet and including:
- a sealed chamber forming a cooling jacket configured to pool coolant around the superconducting magnet;
- a recondensor connected to the cooling jacket and configured to condense evaporated coolant;
- at least one heating component configured to de-ice the recondensor; and
- an evaporated coolant supply channel arranged to deliver evaporated coolant from a coolant vessel to the recondensor; and
- a condensed coolant supply channel arranged to deliver condensed coolant from the recondensor to the coolant vessel.

20. The apparatus of claim 19 wherein the cooling system further includes an evacuation port configured to remove vapor from the sealed chamber that is released from de-icing the recondensor.

21. The apparatus of claim 20 wherein the at least one heating component includes a plurality of induction components which are configured to receive power to de-ice the recondensor through an electrical feedthrough.

22. The apparatus of claim 21 wherein the sealed chamber forms a pressure seal around the superconducting magnet and wherein the electrical feedthrough and the evacuation port pass through the pressure seal.

23. The apparatus of claim 19 wherein at least one heating component includes a first resistive component, a second resistive component, and a third resistive component and wherein the first resistive component is configured to de-ice the recondensor, the second resistive component is configured to de-ice the evaporated coolant supply channel, and the third resistive component is configured to de-ice the condensed coolant supply channel.

24. The apparatus of claim 23 the cooling system further includes an evacuation port configured to remove vapor released from de-icing the recondensor, the evaporated coolant supply channel, and the condensed coolant supply channel.

25. The apparatus of claim 24 wherein the evacuation port is configured to be connected to an auxiliary cooling loop and wherein the auxiliary cooling loop is configured to be connected to the evaporated coolant supply channel.

26. The apparatus of claim 19 wherein the at least one induction heating component is mounted to at least one of the recondensor, the evaporated coolant supply channel, and the condensed coolant supply channel.

27. A method of non-invasive de-icing of a recondensor system of a superconducting MR magnet assembly comprising the steps of:
- heating portions of a recondensing system to melt ice deposits on at least the recondensing system, wherein the recondensing system is configured to condense a coolant of a superconducting MR magnet system;
- vacuumously removing melted ice deposits; and
- wherein the step of heating portions of a recondensing system to melt ice deposits includes sublimating the ice deposits and the step of vacuumously removing includes vacuumously removing the sublimated ice deposits.

28. The method of claim 27 wherein the step of heating portions of the recondensing system further comprises the step of connecting a power source to feed electrical energy to heating components under a pressure seal of a vacuum vessel without breaking the pressure seal and energizing the heating components via the electrical energy.

29. The method of claim 27 wherein the step of vacuumously removing further comprises connecting a vacuum pump to a bypass of a cooling loop to bypass the recondensing system.

30. The method of claim 29 wherein the step of vacuumously removing melted ice deposits include removing gas particles and is performed until a coolant flow is returned to the cooling loop.

31. The method of claim 27 wherein the steps of heating portions of the recondensing system and vacuumously removing gas are performed without quenching a superconducting MR magnet of the superconducting MR magnet system.

32. The method of claim 27 wherein the step of heating portions of the recondensing system to melt ice deposits includes heating the ice deposits to release gas particles and the step of vacuumously removing includes vacuumously removing the gas particles.

33. An MRI apparatus comprising:
- an MRI system having a plurality of gradient coils positioned about a bore of a superconducting magnet to impress a polarizing magnetic field, and an RF transceiver system and an RF switch controlled by a pulse module to transmit RF signals to an RF coil assembly to acquire MR images; and
- a cooling system arranged about the superconducting magnet and including:
  - a sealed chamber forming a cooling jacket configured to pool coolant around the superconducting magnet;
  - a recondensor connected to the cooling jacket and configured to condense evaporated coolant;
  - at least one heating component configured to de-ice the recondensor;
  - an evacuation port configured to remove vapor from the sealed chamber that is released from de-icing the recondensor; and
  - wherein the at least one heating component includes a plurality of induction components which are configured to receive power to de-ice the recondensor through an electrical feedthrough.

34. The apparatus of claim 33 wherein the sealed chamber forms a pressure seal around the superconducting magnet and wherein the electrical feedthrough and the evacuation port pass through the pressure seal.

35. A system to de-ice a recondensor of an Magnetic Resonance (MR) system comprising:
- an MR system having a superconducting magnet in a sealed vessel;
- a recondensing system configured to cool the superconducting magnet including:
  - at least one heating element configured to melt iced particles from the recondensing system; and
  - a power delivery circuit configured to deliver power to the at least one heating element such that the at least one heating element delivers a supply of heat sufficient to melt the iced particles from the recondensing system;
- a vacuum supply configured to remove the melted particles from the recondensing system;
- a vacuum supply valve connected to the recondensing system through a cooling loop and configured to control the vacuum supply;
- a pressure gauge connected to the vacuum supply valve; and wherein the vacuum supply valve and pressure gauge are configured to replace a pressure release valve upon an indication of a pressure build-up indicative of recondensor icing.

36. A system to de-ice a recondensor of an Magnetic Resonance (MR) system comprising:
   an MR system having a superconducting magnet in a sealed vessel;
   a recondensing system configured to cool the superconducting magnet including:
      at least one heating element configured to melt iced particles from the recondensing system; and
      a power delivery circuit configured to deliver power to the at least one heating element such that the at least one heating element delivers a supply of heat sufficient to melt the iced particles from the recondensing system;
   wherein the sealed vessel is pressure-sealed against entry of atmospheric air; and
   wherein the power delivery circuit is configured to deliver power to the at least one heating element through an electrical feedthrough into the pressure-sealed vessel, such that the at least one element generates heat when a power supply is connected to the power delivery circuit.

37. A method of non-invasive de-icing of a recondensor system of a superconducting MR magnet assembly comprising the steps of:
   heating portions of a recondensing system to melt ice deposits on at least the recondensing system, wherein the recondensing system is configured to condense a coolant of a superconducting MR magnet system;
   vacuumously removing melted ice deposits; and
   wherein the step of vacuumously removing further comprises connecting a vacuum pump to a bypass of a cooling loop to bypass the recondensing system.

* * * * *